(12) United States Patent
Ohashi

(10) Patent No.: US 6,215,336 B1
(45) Date of Patent: Apr. 10, 2001

(54) REFERENCE TYPE INPUT FIRST STAGE CIRCUIT IN A SEMICONDUCTOR INTEGRATED CIRCUIT

(75) Inventor: Masayuki Ohashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/302,415

(22) Filed: Apr. 30, 1999

(30) Foreign Application Priority Data

Apr. 30, 1998 (JP) ................................................. 10-120181

(51) Int. Cl.[7] ....................................................... H03K 5/153
(52) U.S. Cl. ................................ 327/77; 327/69; 327/74; 327/403
(58) Field of Search .................................. 327/66, 63, 64, 327/65, 77, 55, 69, 70, 71, 74, 75, 403, 407, 415

(56) References Cited

U.S. PATENT DOCUMENTS

| | | | |
|---|---|---|---|
| 3,309,510 | * | 3/1967 | Brown ..................................... 327/63 |
| 4,017,830 | * | 4/1977 | Shigemori ........................... 340/146.2 |
| 4,547,683 | * | 10/1985 | Bingham ................................ 327/63 |
| 5,032,744 | * | 7/1991 | Liu .......................................... 327/55 |
| 5,598,161 | * | 1/1997 | Yamada ................................ 341/159 |
| 5,617,044 | * | 4/1997 | Takamoto .............................. 327/77 |
| 6,021,037 | * | 2/2000 | Hasler ................................... 361/106 |

FOREIGN PATENT DOCUMENTS

| | | |
|---|---|---|
| 58-186838 | 10/1983 | (JP) . |
| 11-97628 | 4/1999 | (JP) . |

* cited by examiner

*Primary Examiner*—Toan Tran
*Assistant Examiner*—Hiep Nguyen
(74) *Attorney, Agent, or Firm*—Young & Thompson

(57) ABSTRACT

A semiconductor integrated circuit having a plurality of input first stage circuits, each performing a comparison of an individual input signal level to a reference voltage level, wherein a plurality of different reference voltage lines having different reference voltage levels are provided to allow selection of any one of the different reference voltage levels for each of the input first stage circuits.

9 Claims, 5 Drawing Sheets

REFERENCE TYPE INPUT FIRST STAGE CIRCUIT IN A SEMICONDUCTOR INTEGRATED CIRCUIT

BACKGROUND OF THE INVENTION

The present invention relates to a semiconductor integrated circuit and method of forming the same, and more particularly to a reference type input first stage circuit in a semiconductor integrated circuit and a method of forming the same.

In recent years, the requirement for improvement in high speed performance of the semiconductor memory device has been on the increase. In response to the above requirement, a reference type input first stage circuit has been used in place of an invertor type first stage circuit. The reference type input first stage circuit is capable of shortening an operating time by about 1 nanosecond as compared to the invertor type first stage circuit.

FIG. 1 is a circuit diagram illustrative of a first conventional reference type first stage circuit. The first conventional reference type first stage circuit comprises first and second invertor circuits. The first invertor circuit comprises a series connection of a first transistor Q31 and a third transistor Q33 between a high voltage line and a ground line. The first transistor Q31 is connected to the high voltage line, whilst the third transistor Q33 is connected to the ground line. The second invertor circuit also comprises a series connection of a second transistor Q32 and a fourth transistor Q34 between the high voltage line and the ground line. The second transistor Q32 is connected to the high voltage line, whilst the fourth transistor Q34 is connected to the ground line. The first conventional reference type first stage circuit also has a reference voltage input terminal InR3 which is connected to a gate of the third transistor Q33 as well as a signal input terminal In3 which is connected to a gate of the fourth transistor Q34. Gates of the first and second transistors Q31 and Q32 are connected in series to each other through a first node. A gate of the first transistor Q31 is connected to a gate of the second transistor Q32 through a second node. The first node is also connected to the second node. The second and fourth transistors Q32 and Q34 are connected in series to each other through an output node which is connected to an output terminal Out3. The first and second transistors Q31 and Q32 comprise p-channel MOS field effect transistors, whilst the third and fourth transistors Q33 and Q34 comprise n-channel MOS field effect transistors.

The above reference type input first stage circuit has the following advantages as compared to the invertor type input first stage circuit. The first advantage is that the reference type input first stage circuit is superior in high speed performance as compared to the invertor type input first stage circuit. The second advantage is that it is easy to change a first stage characteristic (VIH/VIL) by changing a reference voltage level Vref as inputted into the reference voltage input terminal, wherein "VIH" means a point where the output node connected to the next stage is changed from high level to low level upon sensing of the high level by the first stage when the input signal is changed in level from the low level to the high level, whilst "VIL" means a point where the output node connected to the next stage is changed from low level to high level upon sensing of the low level by the first stage when the input signal is changed in level from the high level to the low level.

The reference type input first stage circuit superior in high speed performances is so sensitive that the first stage characteristic (VIH/VIL) is variable by influences of noises or level shift on a power voltage level Vdd and a ground level. Those level shifts depend upon actual layouts, for example, distances from individual pads, and influences by operations of other circuit near the first stage circuit.

FIG. 2 is a circuit diagram illustrative of a conventional circuit comprising first and second reference type input first stage circuits "A" and "B". The first reference type first stage circuit "A" comprises first and second invertor circuits. The first invertor circuit comprises a series connection of a first transistor Q41 and a third transistor Q43 between a high voltage line and a ground pad 6. The first transistor Q41 is connected to the high voltage line, whilst the third transistor Q43 is connected through a first ground pad resistance Rg1 to the ground pad 6. The second invertor circuit also comprises a series connection of a second transistor Q42 and a fourth transistor Q44 between the high voltage line and the ground line. The second transistor Q42 is connected to the high voltage line, whilst the fourth transistor Q44 is connected through the first ground pad resistance Rg1 to the ground pad 6. The first reference type first stage circuit is connected to a reference voltage generating circuit 1 which is connected through a series connection of first and second resistances R11 and R12 to the ground line. An intermediate point between the first and second resistances R11 and R12 is connected to a gate of the third transistor Q43 for applying a reference voltage Vref to the gate of the third transistor Q43. The first reference type input first stage circuit has a signal input terminal In1 which is connected to a gate of the fourth transistor Q44. Gates of the first and second transistors Q41 and Q42 are connected in series to each other through a first node. A gate of the first transistor Q41 is connected to a gate of the second transistor Q42 through a second node. The first node is also connected to the second node. The second and fourth transistors Q42 and Q44 are connected in series to each other through an output node which is connected to an output terminal Out1. The first and second transistors Q41 and Q42 comprise p-channel MOS field effect transistors, whilst the third and fourth transistors Q43 and Q44 comprise n-channel MOS field effect transistors.

The second reference type first stage circuit "B" comprises first and second invertor circuits. The first invertor circuit comprises a series connection of a first transistor Q51 and a third transistor Q53 between a high voltage line and the ground pad 6. The first transistor Q51 is connected to the high voltage line, whilst the third transistor Q53 is connected through the first ground pad resistance Rg1 and a second ground pad resistance Rg2 to the ground pad 6. The second invertor circuit also comprises a series connection of a second transistor Q52 and a fourth transistor Q54 between the high voltage line and the ground pad 6. The second transistor Q52 is connected to the high voltage line, whilst the fourth transistor Q54 is connected through the first ground pad resistance Rg1 and the second ground pad resistance Rg2 to the ground pad 6. The second reference type first stage circuit is also connected to the reference voltage generating circuit 1 which is connected through the series connection of the first and second resistances R11 and R12 to the ground line. The intermediate point between the first and second resistances R11 and R12 is connected to a gate of the third transistor Q53 for applying a reference voltage Vref to the gate of the third transistor Q53. The reference type input first stage circuit has a signal input terminal In2 which is connected to a gate of the fourth transistor Q54. Gates of the first and second transistors Q51 and Q52 are connected in series to each other through a first node. A gate of the first transistor Q51 is connected to a gate of the second transistor Q52 through a second node. The first node is also connected to the second node. The second and fourth transistors Q52 and Q54 are connected in series to each other through an output node which is connected to an output terminal Out2. The first and second transistors Q51 and Q52 comprise p-channel MOS field effect transistors, whilst the third and fourth transistors Q53 and Q54 comprise n-channel MOS field effect transistors.

The mechanism of the ground level shift will e described with reference to the circuit shown in FIG. 2. The first reference type input first stage circuit "A" is positioned closer to the ground pad 6 than the second reference type input first stage circuit "B". The first reference type input first stage circuit "A" is connected to the ground pad 6 but only through the first ground pad resistance Rg1, whilst the second reference type input first stage circuit "B" is connected to the ground pad 6 through not only the first ground pad resistance Rg1 but also the second ground pad resistance Rg2. The magnitude of the ground level shift depends upon the total resistance between the reference type input first stage circuit and the ground pad, for which reason the magnitude of the ground level shift on the second reference type input first stage circuit "B" is larger than that of the first reference type input first stage circuit "A". The magnitude of the voltage level shift is influenced by the circuit connected to the ground line and operations thereof. This mechanism is also applied to the power voltage line.

The above reference type first stage circuit capable of showing the high speed performance has a serious problem with variation in the first stage characteristic (VIH/VIL) due to power voltage level shift or ground voltage level shift. This problem with the power voltage level shift or the ground voltage level shift is caused on the layout of the reference type first stage circuits. This possible variation in the first stage characteristic (VIH/VIL) reduces margins to the required specifications or may cause the problem in spec-out. The reference type first stage circuit with the reduced margin to the first stage characteristic (VIH/VIL) may cause other problem with possible malfunction due to slight noises.

It is theoretically possible that simulations are made on design and evaluation processes to conduct previous investigations on noises and shifts of the power voltage level and the ground level, so that reference voltage levels are adjusted with reference to the individual positions of the reference type input first stage circuit. Actually, however, it is difficult to apply the above method to large capacity memory deices such as 16 megabits or 64 megabits. It is difficult for the limited hardware for simulation and for the limited design processes to find worst conditions through simulations in all timings in consideration of all of the memory cells. This difficulty may lead to such a further problem that the worst conditions on the actual products become remarkable on the evaluation process even the worst conditions could not be difficult to be found out. For this reason, it may be necessary to do large scale modification and to the circuit and mask in order to keep the necessary margin.

In the above circumstances, it had been required to develop a novel reference type input first stage circuit and a method of forming the same free from the above problem.

SUMMARY OF THE INVENTION

Accordingly, it is an object of the present invention to provide a novel reference type input first stage circuit free from the above problems.

It is a further object of the present invention to provide a novel reference type input first stage circuit with a large margin to the first stage characteristic (VIH/VIL) by a trimming after the product has been manufactured or by a minimum modification to the mask.

The present invention provides a semiconductor integrated circuit having a plurality of input first stage circuits, each performing a comparison of an individual input signal level to a reference voltage level, wherein a plurality of different reference voltage lines having different reference voltage levels are provided to allow selection of any one of the different reference voltage levels for each of the input first stage circuits.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The present invention provides a semiconductor integrated circuit having a plurality of input first stage circuits, each performing a comparison of an individual input signal level to a reference voltage level, wherein a plurality of different reference voltage lines having different reference voltage levels are provided to allow selection of any one of the different reference voltage levels for each of the input first stage circuits.

It is preferable that at least a voltage divider circuit and a single reference voltage generator are provided to generate the different reference voltage levels.

It is also preferable that the voltage divider circuit comprises a resistive circuit having a plurality of resistances which are allowed to be trimmed.

It is also preferable that at least a master slice selecting circuit is provided for selection of any one of the different reference voltage levels.

It is also preferable that a plurality of transfer gates are provided for selection of any one of the different reference voltage levels.

It is also preferable that at least a fuse and at least a Zener diode are provided for selection of any one of the different reference voltage levels.

Figure 1:
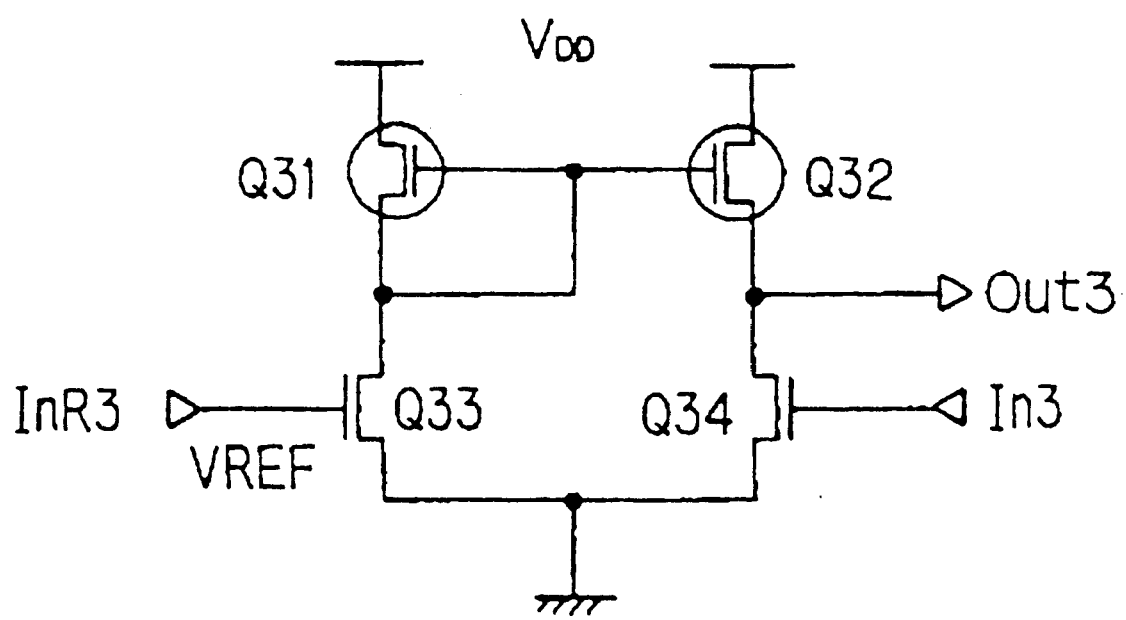
FIG. 1 is a circuit diagram illustrative of a first conventional reference type first stage circuit.
Figure 2:
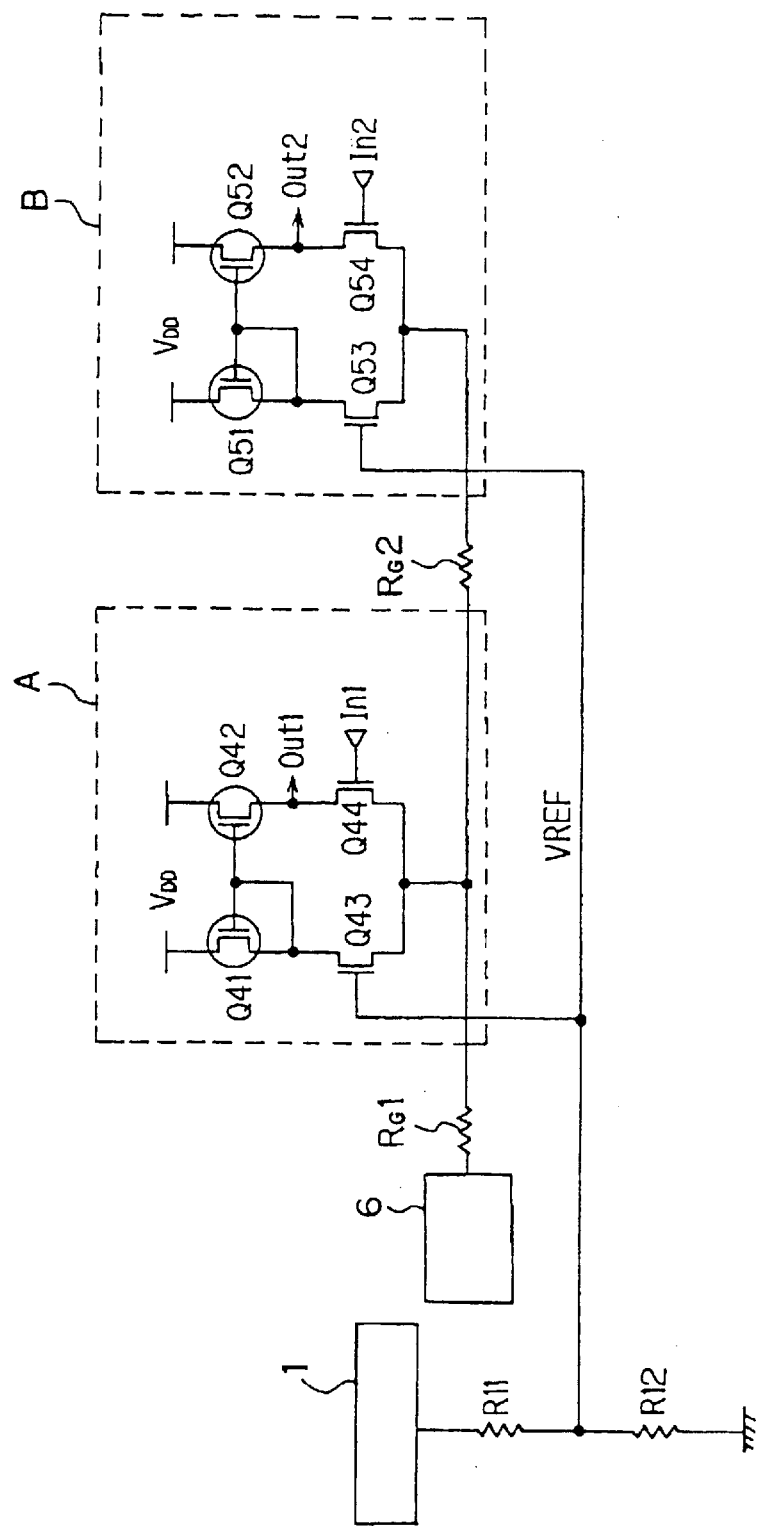
FIG. 2 is a circuit diagram illustrative of a conventional circuit comprising first and second reference type input first stage circuits "A' and "B".
Figure 3:
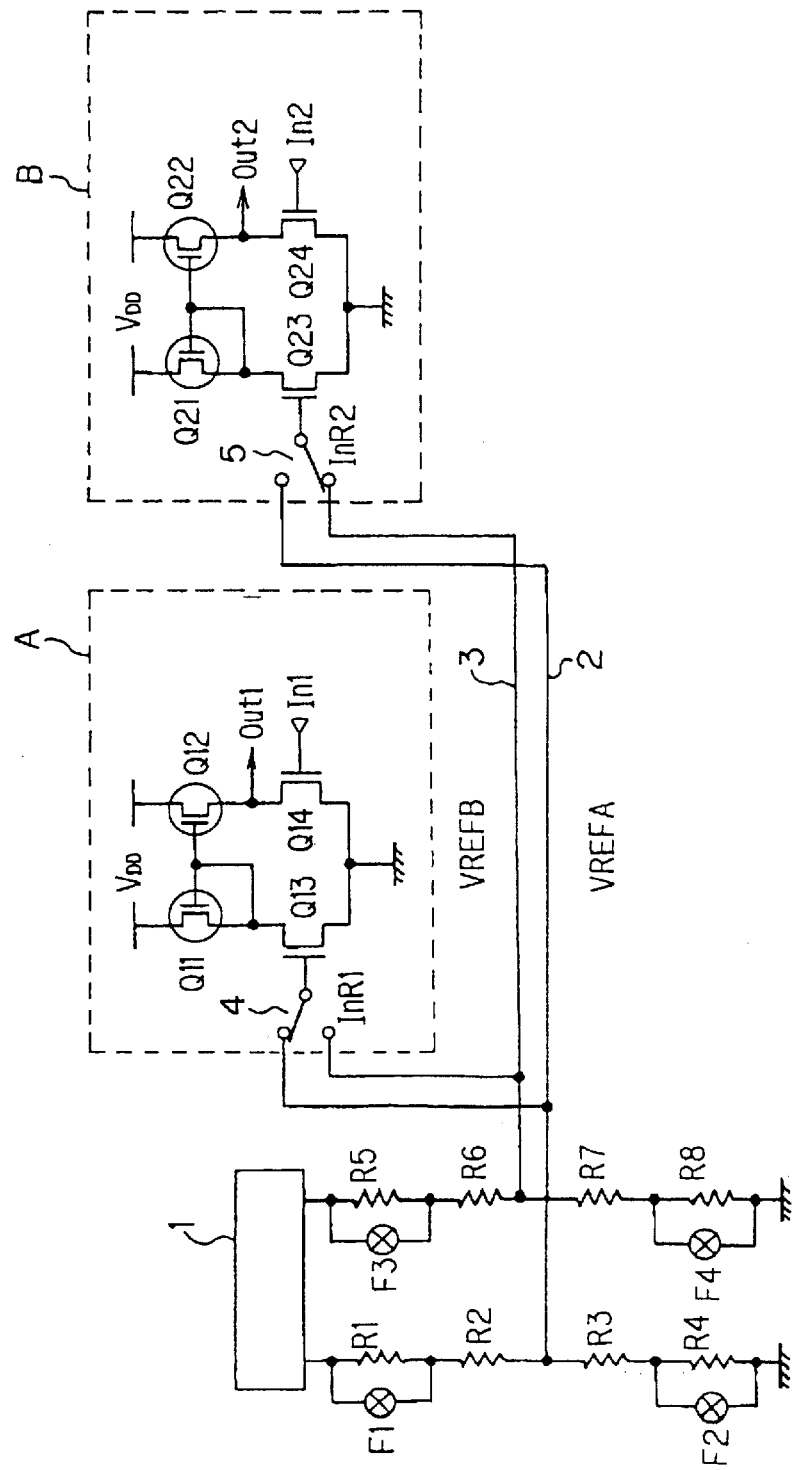
FIG. 3 is a circuit diagram illustrative of a novel semiconductor integrated circuit comprising first and second reference type input first stage circuits "A" and "B" in accordance with the present invention.

A first embodiment according to the present invention will be described in detail with reference to FIG. 3 which is a circuit diagram illustrative of a novel semiconductor integrated circuit comprising first and second reference type input first stage circuits "A" and "B". In the actual semiconductor integrated circuit, a large number of the reference type input first stage circuits are provided for clock, address and data-in. Notwithstanding, for convenience of the descriptions, the number of the reference type input first stage circuits is limited to the minimum number of plurality, or two.

The first reference type first stage circuit "A" comprises a differential circuit which further comprises first and second invertor circuits, a first reference voltage input terminal InR1 connected to the first invertor circuit, a first output terminal connected to the second invertor circuit, and a first signal input terminal In1 connected to the second invertor circuit as well as a first master slice selecting circuit 4. The first master slice selecting circuit 4 is connected through first and reference voltage line 2 and 3 to first and second resistance divider circuits respectively which are further provided between a reference voltage generator circuit 1 and a ground line. The first and second reference voltage line 2 and 3 are supplied with first and second reference voltages "VrefA" and VrefB" from the reference voltage generating circuit 1. The first resistance divider circuit comprises a series connection of first, second, third and fourth resistances R1, R2, R3 and R4 between the reference voltage generating circuit 1 and the ground line, as well as a first fuse F1 connected in parallel to the first resistance R1 and a second fuse F2 connected in parallel to the fourth resistance R4. The second resistance divider circuit comprises a series connection of fifth, sixth, seventh and eighth resistances R5, R6, R7 and R8 between the reference voltage generating circuit 1 and the ground line, as well as a third fuse F3 connected in parallel to the fifth resistance R5 and a fourth fuse F4 connected in parallel to the eighth resistance R8. The first reference voltage line 2 is connected to an intermediate point between the second and third resistances R2 and R3 of the first resistance divider circuit. The second reference voltage line 3 is connected to an intermediate point between the sixth and seventh resistances R6 and R7 of the second resistance divider circuit.

The first invertor circuit comprises a series connection of a first transistor Q11 and a third transistor Q13 between the high voltage line and the ground line. The first transistor Q11 is connected to the high voltage line, whilst the third transistor Q13 is connected through the ground line. The second invertor circuit also comprises a series connection of a second transistor Q12 and a fourth transistor Q14 between the high voltage line and the ground line. The second transistor Q12 is connected to the high voltage line, whilst the fourth transistor Q14 is connected to the ground line. The first reference type input first stage circuit has a signal input terminal "In1" which is connected to a gate of the fourth transistor Q14. Gates of the first and second transistors Q11 and Q12 are connected in series to each other through a first node. A gate of the first transistor Q11 is connected to a gate of the second transistor Q12 through a second node. The first node is also connected to the second node. The second and fourth transistors Q12 and Q14 are connected in series to each other through an output node which is connected to an output terminal Out1. The first and second transistors Q11 and Q12 comprise p-channel MOS field effect transistors, whilst the third and fourth transistors Q13 and Q14 comprise n-channel MOS field effect transistors. A gate of the third transistor Q13 is connected to the reference signal input terminal InR1. A gate of the fourth transistor Q14 is connected to the signal input terminal In1. An intermediate point between the second and fourth transistors Q12 and Q14 is connected to the output terminal Out1.

The above fuses F1 F2, F3 and F4 are provided for allowing resistance trimming so as to supply two different reference voltages VrefA and VrefB to the first master slice selecting circuit 4 of the first reference type first stage circuit "A".

The second reference type first stage circuit "B" also comprises a differential circuit which further comprises first and second invertor circuits, a second reference voltage input terminal InR2 connected to the first invertor circuit, a second output terminal Out2 connected to the second invertor circuit, and a second signal input terminal In2 connected to the second invertor circuit as well as a second master slice selecting circuit 5. The second master slice selecting circuit 5 is connected through the first and reference voltage line 2 and 3 to the first and second resistance divider circuits respectively which are further provided between the reference voltage generator circuit 1 and the ground line. The first and second reference voltage line 2 and 3 are supplied with the first and second reference voltages "VrefA" and "VrefB" from the reference voltage generating circuit 1.

The first invertor circuit comprises a series connection of a first transistor Q21 and a third transistor Q23 between the high voltage line and the ground line. The first transistor Q21 is connected to the high voltage line, whilst the third transistor Q23 is connected through the ground line. The second invertor circuit also comprises a series connection of a second transistor Q22 and a fourth transistor Q24 between the high voltage line and the ground line. The second transistor Q22 is connected to the high voltage line, whilst the fourth transistor Q24 is connected to the ground line. The first reference type input first stage circuit has a signal input terminal "In2" which is connected to a gate of the fourth transistor Q24. Gates of the first and second transistors Q21 and Q22 are connected in series to each other through a first node. A gate of the first transistor Q21 is connected to a gate of the second transistor Q22 through a second node. The first node is also connected to the second node. The second and fourth transistors Q22 and Q24 are connected in series to each other through an output node which is connected to an output terminal Out1. The first and second transistors Q21 and Q22 comprise p-channel MOS field effect transistors, whilst the third and fourth transistors Q23 and Q24 comprise n-channel MOS field effect transistors. A gate of the third transistor Q23 is connected to the reference signal input terminal InR2. A gate of the fourth transistor Q24 is connected to the signal input terminal In2. An intermediate point between the second and fourth transistors Q22 and Q24 is connected to the output terminal Out2.

The above fuses F1 F2, F3 and F4 are provided for allowing resistance trimming so as to supply two different reference voltages VrefA and VrefB to the second master slice selecting circuit 5 of the second reference type input first stage circuit "B".

The master slice circuit is capable of changing a connection path in the master slice method or example by changing a mask for forming an aluminum interconnection.

The above first and second reference type input first stage circuits "A" and "B" are different from each other in distances from the power voltage pad and the ground voltage pad. In this embodiment, for example, in the process for forming the aluminum interconnections, the first reference signal input terminal InR1 of the first reference type input first stage circuit "A" is connected to the first reference voltage line 2, whilst the second reference signal input terminal InR2 of the second reference type input first stage circuit "B" is connected to the second reference voltage line 3. The first reference voltage level VrefA is set higher than the second reference voltage level VrefB. The wafer test is made for measuring the first stage characteristics (VIH/VIL) for each of the first and second reference type input first stage circuits "A" and "B" after the above circuit has been completed. If it could be confirmed that the first reference type input first stage circuit "A" has such an insufficient margin to the VIH that the inversion of the output signal is unlikely to appear upon changing the low level to the high level of the input signal, then the first fuse F1 is cut to drop the first reference voltage level VrefA. If it could be confirmed that the first reference type input first stage circuit "A" has such an insufficient margin to the VIH that the inversion of the output signal is likely to appear upon changing the low level to the high level of the input signal, then the second fuse F2 is cut to rise the first reference voltage level VrefA. If it could be confirmed that the second reference type input first stage circuit "B" has such an insufficient margin to the VIL that the inversion of the output signal is likely to appear upon changing the high level to the low level of the input signal, then the third fuse F3 is cut to drop the second reference voltage level VrefB.

If cutting the fuse is insufficient to adjust the reference voltage levels to be supplied, it may be possible that the mask is changed to connect the first reference signal input terminal InR1 to the second reference voltage line VrefB, or the mask is changed to connect the second reference signal input terminal InR2 to the first reference voltage line VrefB.

It is possible to increase the number of the fuses for more precise and large adjustment to the reference voltage level.

Further, in place of the resistance-rimming by use of the fuses, laser trimming upon irradiation of the laser beam or applying a large current to the Zener diodes.

Figure 4:
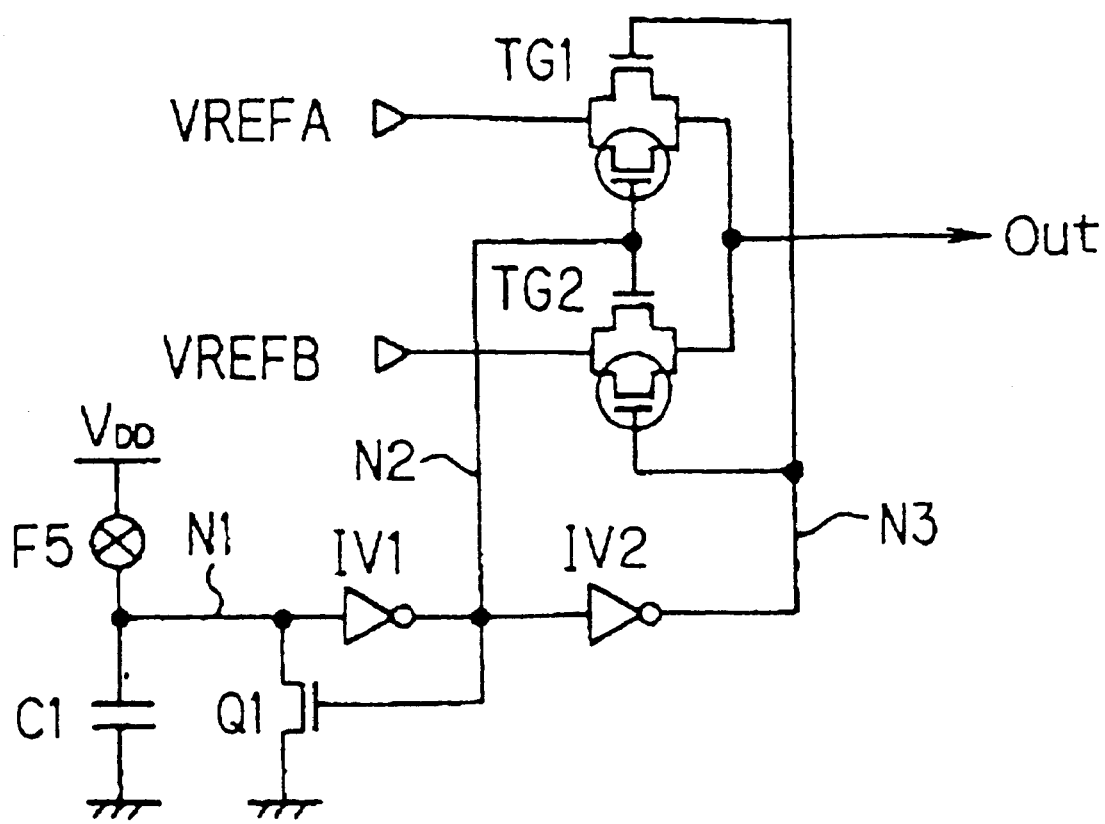
FIG. 4 is a circuit diagram illustrative of a first equivalent circuit to the above novel circuit in accordance with the present invention.

FIG. 4 is a circuit diagram illustrative of a first equivalent circuit to the above novel circuit in accordance with the present invention. In the above embodiment, the reference voltage level to be inputted into the reference voltage input terminals is selected by the aluminum interconnection formed in the master slice method. As a modification to the above, it is, however, possible that the first stage circuit characteristics (VIH/VIL) are measured in the wafer test so that upon the basis of the measurement result, any one of the first and second reference voltage levels VrefA and VrefB is selected. Namely, any one of first and second transfer gates TG1 and TG2 is made conductive to select the reference voltage level. The transfer gates TG1 and TG2 are controlled by the fuse F5, a capacitor C1, a transistor Q1, invertors IV1 and IV2. As in FIG. 3, the fuse F5 is not cut, for which reason a node N1 is high level. As a result, a second node N2 is low level and a third node N3 is high level, whereby the first transfer gate TG1 is made conductive so that the first reference voltage level VrefA appears on the output terminal Out. If the fuse F5 is cut, then the node voltages levels are inverted thereby making the transfer gate TG2 conductive so that the second reference voltage level VrefB appears on the output terminal.

Figure 5:
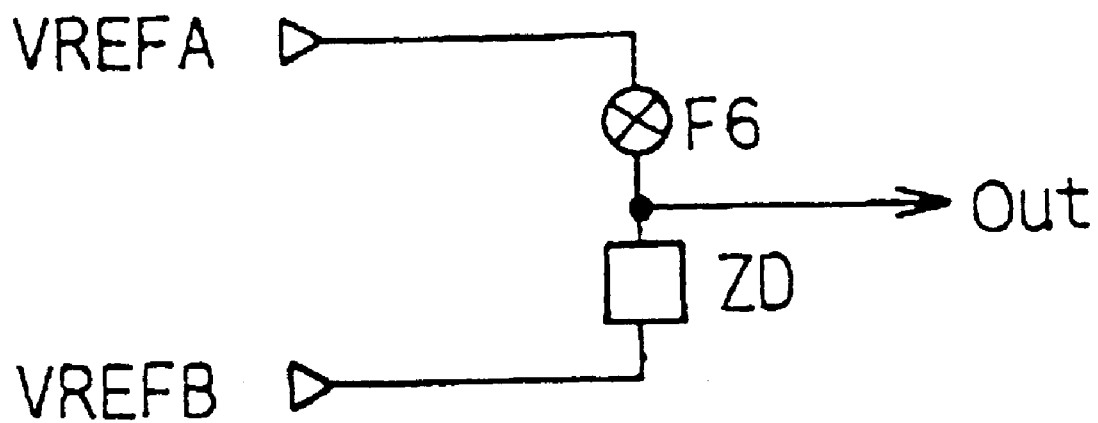
FIG. 5 is a circuit diagram illustrative of a first equivalent circuit to the above novel circuit in accordance with the present invention.

FIG. 5 is a circuit diagram illustrative of a first equivalent circuit to the above novel circuit in accordance with the present invention. In the above embodiment, the reference voltage level to be inputted into the reference voltage input terminals is selected by the aluminum interconnection formed in the master slice method. As a modification to the above, it is, however, possible that the first stage circuit characteristics (VIH/VIL) are measured in the wafer test so that upon the basis of the measurement result, any one of the first and second reference voltage levels VrefA and VrefB is selected. If a fuse F6 is not cut, the first reference voltage level VrefA appears on the output terminal. If as a result of the wafer test, it is confirmed that the connection to the second reference voltage line 3 is preferable, then the fuse F6 is cut to form short circuit to the Zener diode.

In accordance with the above novel semiconductor integrated circuit, a plurality of different reference voltage level lines are provided for allowing a selection of any one of the plurality of different reference voltage level lines by changing a mask for layout of the interconnections or the mask change after the wafer process has been completed, without any large scale circuit configuration change or mask change for forming the circuits, whereby the insufficient margin or spec-out problems can be prevented. Further, the trimming after the wafer process allows a precise or accurate adjustment to the plural reference voltage levels, whereby a highly accurate or precise control o the first stage characteristic. Furthermore, the reference voltage level of the input first stage circuit of the clock is shifted to shift the rising and falling edges of the clock, whereby the operational margin of the signal operated with reference to the clock signal is improved.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor integrated circuit having a plurality of input first stage circuits, each performing a comparison of an individual input signal level to a reference voltage level, wherein a plurality of different reference voltage lines having different reference voltage levels are provided to allow selection of any one of said different reference voltage levels for each of said input first stage circuits.

2. The semiconductor integrated circuit as claimed in claim 1, wherein at least a voltage divider circuit and a single reference voltage generator are provided to generate said different reference voltage levels.

3. The semiconductor integrated circuit as claimed in claim 2, wherein said voltage divider circuit comprises a resistive circuit having a plurality of resistances which are allowed to be trimmed.

4. The semiconductor integrated circuit as claimed in claim 2, wherein at least a master slice selecting circuit is provided for selection of any one of said different reference voltage levels.

5. The semiconductor integrated circuit as claimed in claim 2, wherein a plurality of transfer gates are provided for selection of any one of said different reference voltage levels.

6. The semiconductor integrated circuit as claimed in claim 2, wherein at least a fuse and at least a Zener diode are provided for selection of any one of said different reference voltage levels.

7. A semiconductor integrated circuit comprising:

plural input first stages that each compare an individual input signal level to a reference voltage level; and plural reference voltage lines that are each selectively connected to each of said plural input first stages, each of said plural reference voltage lines having a different voltage level that is selectable as the reference voltage level for any of said plural input first stages.

8. The circuit of claim 7, wherein each of said plural input first stages comprises a switch for selectively connecting one of said plural reference voltage lines thereto.

9. The circuit of claim 8, wherein each of said plural reference voltage lines has plural resistors selectively connected thereto.

* * * * *